United States Patent [19]
Bauer et al.

[11] Patent Number: 5,145,764
[45] Date of Patent: Sep. 8, 1992

[54] POSITIVE WORKING RESIST COMPOSITIONS PROCESS OF EXPOSING, STRIPPING DEVELOPING

[75] Inventors: Richard D. Bauer, Kennett Square, Pa.; Gwendyline Y. Y. Chen, Wilmington, Del.; Walter R. Hertler, Kennett Square, Pa.; Robert C. Wheland, Wilmington, Del.

[73] Assignee: E. I. Du Pont de Nemours and Company, Wilmington, Del.

[21] Appl. No.: 757,081

[22] Filed: Sep. 10, 1991

Related U.S. Application Data

[62] Division of Ser. No. 507,337, Apr. 10, 1990, Pat. No. 5,077,174.

[51] Int. Cl.$^5$ .............................................. G03C 1/90
[52] U.S. Cl. .................... 430/260; 430/256; 430/270; 430/271; 430/326
[58] Field of Search ............... 430/256, 260, 270, 271, 430/325, 326; 522/31, 127, 154

[56] References Cited

U.S. PATENT DOCUMENTS

| | | |
|---|---|---|
| 3,779,778 | 12/1973 | Smith et al. . |
| 4,193,797 | 3/1980 | Cohen et al. . |
| 4,491,628 | 1/1985 | Ito et al. . |
| 4,678,737 | 7/1987 | Schneller et al. .................... 430/270 |
| 4,887,450 | 6/1975 | Gilano et al. . |
| 4,898,803 | 2/1990 | Aoai et al. ............................ 430/270 |
| 4,916,046 | 4/1990 | Dossell ................................ 430/270 |
| 4,951,379 | 6/1990 | Brunsvold et al. ................. 430/270 |

FOREIGN PATENT DOCUMENTS 0264908  10/1986  European Pat. Off. .

OTHER PUBLICATIONS

"Printed Circuits Handbook", Chapter 6, Clyde F. Coombs, ed., Second Edition, McGraw-Hill, Inc. (1979).

"Photoresist Mat'ls and Processess", Chapter 5, W. S. deForest, McGraw-Hill Book Company (1975).

J. E. Kearns, et al., J. Macromol. Sci.-Chem. A8(4): 673-685 (1974).

Primary Examiner—Jack P. Brammer

[57] ABSTRACT

This invention relates to positive working resist compositions having utility in dry film photoresists and to fully aqueous methods for developing and stripping them.

28 Claims, No Drawings

POSITIVE WORKING RESIST COMPOSITIONS PROCESS OF EXPOSING, STRIPPING DEVELOPING

This is a division of application Ser. No. 507,337, filed Apr. 10, 1990 now U.S. Pat. No. 5,077,174.

FIELD OF THE INVENTION

This invention relates to positive working resist compositions having utility in dry film photoresists and to fully aqueous processes for developing and stripping them.

BACKGROUND OF THE INVENTION

Modern high resolution photoresists require high photospeed for productivity, superior image integrity, and fully aqueous development and stripping. All aqueous processing is needed because the organic solvents that have been used in the past are being replaced because of increasingly demanding environmental restrictions.

In U.S. Pat. No. 3,779,778, novel photo-solubilizable compositions are disclosed that compromise 1) a water-insoluble compound containing one or more acid-degradable groups, and 2), a photoinitiator comprising a photolyzable acid progenitor. The useful water-insoluble compounds can contain one or more acid-degradable linkage which can be formed by the nucleophilic reaction of phenols, N-alkyl arylsulfonamides, or certain secondary amines with alkyl vinyl ethers, e.g. methyl vinyl ether, ethyl vinyl ether or a dihydropyran.

A dry film resist prepared according to this invention from the tetrahydropyranyl ether of a phenolic resin and a photoacid generator required a mixture of a flammable organic alcohol, potassium hydroxide and water to develop away the exposed areas.

European Patent Application 0 264 908 discloses resists comprised of at least one polymer, copolymer, or terpolymer having recurrent acid labile groups pendant to the polymer backbone wherein the improvement comprises: selecting a substituent side chain on said acid labile groups which is capable of forming secondary carbonium ion intermediates and having an available proton adjacent to the carbonium ion formed during cleavage. The autodecomposition temperature of the polymer comprising the photoresist is increased, to a temperature greater than about 160° C., by selecting substituent side chains on the acid labile group which exhibit a less stable intermediate carbonium ion than the t-butyl ion.

In U.S. Pat. No. 4,491,628, resists sensitive to UV, electron beam and x-ray radiation with positive or negative tone upon proper choice of a developer are formulated from a polymer having recurrent pendant groups such as tert-butyl ester or tert-butyl carbonate groups that undergo efficient acidolysis with concomitant changes in polarity (solubility) together with a photoinitiator which generates acid upon radiolysis. A sensitizer component that alters wavelength sensitivity of the composition may also be added. The preferred acid labile pendant groups are tert-butyl esters of carboxylic acids and tert-butyl carbonates of phenols but, it is understood that a wide range of acid labile groups are operative in the invention. These include trityl, benzyl, benzhydryl modifications as well as others well known in the art.

A dry film resist prepared according to this invention from poly(tert-butyl acrylate) and a photoacid generator required heating of the exposed image at 100° C. for up to 15 minutes in order to solubilize the polymer in fully aqueous base. The resulting developed image had ragged edges.

The production of printed circuits using a variety of resists is described in "Printed Circuits Handbook" edited by Clyde F. Coombs, Second Edition, published by McGraw-Hill, Inc., 1979. Chapter 6 of this publication describes the use of both negative-working and positive-working photoresists in the preparation of printed circuits. In particular, section 14 of this chapter discusses conventional positive-working liquid photoresists and section 16 discusses conventional coating methods for applying such photoresists to printed circuit substrates. Likewise, the production of printed circuits using photoresists is described in "Photoresist Materials and Processes" by W. S. DeForest published by McGraw-Hill Book Company, 1975. In particular, Chapter 5 of this publication discusses conventional positive resists and the processes of their use to manufacture printed circuits.

U.S. Pat. No. 3,469,982 discloses a process for forming a photoresist comprising (1) applying to a surface the surface of a solid unexposed photosensitive layer of thermoplastic photohardenable material, the other surface being adhered to a film support, then in either order (2) exposing the layer, and (3) stripping the support, and then (4) washing away the unexposed areas of the layer. The surface bearing the resist can be etched, plated, or treated in other ways. The photoactive materials disclosed in this case are photopolymerizable compounds.

Typical fully aqueous negative acting dry film photoresists used in the process described in this invention are described in Gilano, U.S. Pat. No. 3,887,450. They contain alkali soluble carboxylic acid containing polymers and photocrosslinkable acrylic acid monomers. Such compositions are developable in aqueous alkali and strippable in stronger aqueous alkali. However, they have marginal resistance, if any, to alkaline processes such as ammoniacal cupric chloride etchants or electroless copper plating baths which are typically used to form copper circuits. These negative acting coatings cannot be imagewise re-exposed with the same radiation used to produce the original image and developed to form a second image which could be used to modify the substrate a second time.

A very useful property of negative acting dry film photoresists is the capacity to cover or "tent" over holes in the substrate which need to be protected from the reagents which are used to modify the substrate. For example, if there are plated holes in the substrate that will ultimately provide electrical contact between circuit traces on both sides of the circuit panel, they must be protected during an etching operation that would be used to form the circuit traces. The tents often require a high level of exposure to crosslink them sufficiently so that they are not attacked by the alkaline development process; that level of exposure is often too high for optimum artwork reproduction.

U.S. Pat. No. 4,193,797 discloses a positive active dry film process for forming a photoresist comprising (1) applying to a surface the surface of a solid unexposed photosensitive layer of thermoplastic photosoluble or photodensitizable material, the other surface being releasedly adhered to a film support, then in either order (2) exposing the layer to actinic radiation, and (3) removing the film support, and then (4) washing away exposed areas of the layer to uncover areas of the underlying surface. The uncovered areas of the underlying surface can be etched, plated or otherwise modified. The photoactive materials disclosed in this invention include photodesensitizable bisdiazonium salt compositions, which required solvent development, and photosolubilizable o-quinone-diazides. These suffer from inherently high optical density in anything but thin coatings and slow photospeed. The thin coatings described in this invention (0.35 mils) would hardly be useful in typical dry film resist processes like plating and tenting.

The positive acting dry film resist compositions of the current invention are fully aqueous, have high photospeed, do not require the use of high temperature bakes after exposure to solubilize the exposed image, can tent over holes in the substrate, and give high resolution images with good line quality. Properly formulated, the resist image can withstand both alkaline and acid etching and plating processes typically used to modify substrates in the preparation of printed circuit boards. The resist image can then be blank exposed and stripped in aqueous alkali or re-exposed imagewise and developed so that the substrate can be modified a second time without the need to apply a second resist.

The resist compositions of the instant invention contain thermally stable but acid labile α-alkoxyalkyl esters of carboxylic acids, e.g., tetrahydropyranyl esters.

J. E. Kearns et al., J. Macromol. Sci.-Chem. A8(4), pp. 673-685 (1974) describe the preparation and deesterification of a number of polymers and copolymers of unsaturated tetrahydropyranyl esters. The utility of dihydropyran as a protecting group in the preparation of polymers containing other groups susceptible to normal hydrolysis conditions is ascribed to the mild conditions required to remove the tetrahydropyranyl group from these esters.

None of the prior art of which we are aware shows the use of the polymers of the present invention in dry film photoresist compositions. Moreover, none of the prior art of which we are aware discloses resist formulations usable in dry film photoresists containing a polymer bearing recurring pendant acid labile groups that possess the structures disclosed in the present invention.

SUMMARY OF THE INVENTION

The present invention lies in resist formulations capable of being used in dry film photoresist applications that contain polymers that possess recurring pendant acid labile α-alkoxy alkyl carboxylic acid ester groups in the presence of an acid generator activated by incident radiant energy.

The present invention provides a dry film photoresist element capable of developing a latent image without post exposure elevated temperature and developable to a resist image in an all aqueous alkali comprising a thin flexible polymeric film support having adhered thereto with low to moderate adherence a solid photosensitive layer having a thickness of about 0.3 mils (~8 microns) or greater said layer comprising:

(a) a polymer chosen from the group consisting of compositions having a polymer backbone and pendant acid-labile groups which are bound directly or indirectly to the polymer backbone, said pendant acid-labile groups represented by the formula:

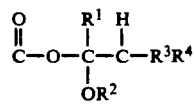

or

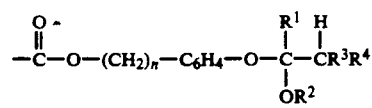

where $R^1$ is hydrogen or lower alkyl (up to about 6 carbon atoms); $R^2$ is lower alkyl (up to about 6 carbon atoms); and $R^3$ and $R^4$ independently are hydrogen or lower alkyl where the definition of lower alkyl includes the joining of $R^1$ and $R^2$ or $R^1$ and either $R^3$ or $R^4$, or $R^2$ and either $R^3$ or $R^4$ to form a 5-, 6-, or 7-membered ring;

(b) an initiator system comprising an initiator or an initiator and at least one sensitizer, that forms upon exposure to actinic radiation having a wavelength between about 3000 Å and about 9000 Å, a catalytic amount of a strong acid preferably having a pKa equal to or less than 2; and (c) optionally additives such as, but not limited to, plasticizers, colorants, adhesion promoters and surfactants.

The present invention also provides a process for forming a positive photoresist on a surface which comprises:

a. applying to said surface the surface of a solid, unexposed, photosensitive layer having a thickness of at least 0.3 mils (~8 microns), said layer comprised of (a) a polymer chosen from the group consisting of compositions having a polymer backbone and pendant acid-labile groups which are bound directly or indirectly to the polymer backbone, said pendant acid-labile groups represented by the formula:

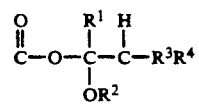

or

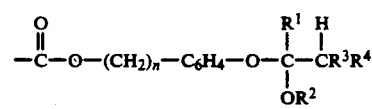

where n=0-4; $R^1$ is hydrogen or lower alkyl (up to about 6 carbon atoms); $R^2$ is lower alkyl (up to about 6 carbon atoms); and $R^3$ and $R^4$ independently are hydrogen or lower alkyl where the definition of lower alkyl includes the joining of $R^1$ and $R^2$ or $R^1$ and either $R^3$ or $R^4$, or $R^2$ and either $R^3$ or $R^4$ to form a 5-, 6-, or 7-membered ring; (b) an initiator system that forms a catalytic amount of strong acid upon exposure to actinic radiation having a wavelength between about 3000 Å and about 9000 Å; and (c) optionally, plasticizers, colorants and adhesion promoters, surfactants, the other surface of the layer having adhered thereto with low to moderate adherence a thin, flexible, polymeric film support; then in either order;

b. exposing the layer, imagewise, to actinic radiation to form an image;
c. stripping the film support from the resulting image-bearing layer; and then;
d. washing away the exposed areas of the layer to form a positive resist image;
e. permanently modifying the adjacent areas on the substrate surface which are unprotected by the resist image by using a reagent capable of etching said areas or depositing a material on said areas; and
f. blank exposing the resist image and stripping it from the resist in aqueous alkali.

The invention further concerns a process for forming a positive resist on a surface which process comprises:
a. applying to said surface the surface of a solid, unexposed, photosensitive layer having a thickness of at least 0.3 mils (approximately 8 microns), said layer comprised of (a) a polymer chosen from the group consisting of compositions having a polymer backbone and pendant acid-labile groups which are bound directly or indirectly to the polymer backbone, said pendant acid-labile groups represented by the formula:

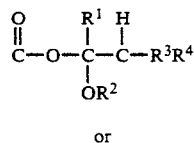

or

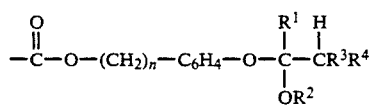

where $n=0-4$; $R^1$ is hydrogen or lower alkyl (up to about 6 carbon atoms); $R^2$ is lower alkyl (up to about 6 carbon atoms); and $R^3$ and $R^4$ independently are hydrogen or lower alkyl where the definition of lower alkyl includes the joining of $R^1$ and $R^2$ or $R^1$ and either $R^3$ or $R^4$, or $R^2$ and either $R^3$ or $R^4$ to form a 5-, 6-, or 7-membered ring; (b) an initiator system that forms a catalytic amount of strong acid upon exposure to actinic radiation having a wavelength between about 3000 Å to about 9000 Å, and (c) optionally, plasticizers, colorants and adhesion promoters, surfactants, the other surface of the layer having adhered thereto with low to moderate adherence a thin, flexible, polymer film support; then in either order;
b. exposing the layer, imagewise, to actinic radiation to form an image;
c. stripping the film support from the resulting image-bearing layer; and then,
d. washing away the exposed areas of the layer to form a positive resist image;
e. permanently modifying the adjacent areas on the substrate surface which are unprotected by the resist image by using a reagent capable of etching said areas or depositing a material on said area, and, without the need to apply a second coating of photosensitive material;
f. imagewise exposing the resist layer again to form a second latent image;
g. washing away the exposed areas of the layer to form a positive resist image;
h. permanently modifying the adjacent areas on the substrate surface which are unprotected by the resist image by using a reagent capable of etching said areas or depositing a material on said area;
i. solubilizing the resist and stripping it from the substrate.

DETAILED DESCRIPTION OF THE INVENTION

This invention is based on the discovery that polymers with pendant acid labile α-alkoxy alkyl esters of carboxylic acids or α-alkoxyalkyl ethers of 4-hydroxybenzyl esters can unexpectedly be made into stable high resolution fully aqueous developable positive acting dry film photoresists which are capable of withstanding both acid and alkaline processes typically used in the formation of printed circuits and have the capacity to protect holes in the substrate by tenting them.

Tenting is the process of forming a pad of resist over a hole in the substrate. It is surprising that these uncrosslinked positive resists would survive the hot alkaline high pressure sprays typically used to develop dry film resists considering the high level of photocrosslinking required for the survival of tents made using negative resists. A distinct advantage of the positive dry film resists of the present invention that becomes clear with this discovery is that the formulation can be optimized for tenting independent of exposure, since the tents themselves are not exposed in making the image. In making the image, exposures can be set for optimum reproduction of the artwork because there is no exposure requirements for the tents.

In order to be developed after exposure, the resists described in the prior art which were based on polymers with pendant α-alkoxyalkyl ethers of phenols required aqueous alkaline solutions containing flammable alcohols. Surprisingly, the resists based on the phenolic α-alkoxyalkyl ethers of 4-hydroxy benzyl esters of the present invention are soluble in all aqueous alkali after exposure.

The dry film resists of the current invention are formulated to flow at about 100° C. so that they can be laminated to substrates under heat and pressure. When resists were made with acid labile t-butyl esters of carboxylic acids, as described in the prior art, heating to 100° C. after exposure was required to solubilize the polymer. The resulting developed image had distorted line edges. Resists of the current invention based on α-alkoxyalkyl esters of carboxylic acids can be solubilized after exposure by holding at room temperature for a brief period or by mild heating at less than 100° C. The developed images have sharp line edges.

Finally, the resists of the present invention, when properly formulated, will withstand aqueous acid and alkaline etching and plating processes and even strongly alkaline processes such as electroless copper plating baths, yet they are developable and strippable in all aqueous alkali. A subsequent re-exposure and development of the original image to form a second image or a blank re-exposure and development for stripping is still possible.

Polymeric Material

The polymers used in these resists have pendant acid labile groups which are bound directly or indirectly to the polymer backbone. Acrylic, vinyl, polyester, and polyurethane backbones are all possible.

The polymeric materials of the present invention are made by methods known in the art. The polymers can be prepared by free radical polymerization, Group Transfer polymerization, or by other polymerization methods known in the art. The pendant acid labile groups may be selectively attached to the polymer backbone as part of the monomeric components used to form the backbone or after the backbone has been formed. Typically, monomeric components each containing an acid labile group (or sites to which such groups may be later attached) are copolymerized in suitable proportions to produce the polymeric material. Additional conventional monomer components may be incorporated in the copolymerization process to further modify polymeric material characteristics, e.g., to change the hardness, Tg, and the like.

The pendant acid labile groups useful in the compositions of this invention can be described by the formulae:

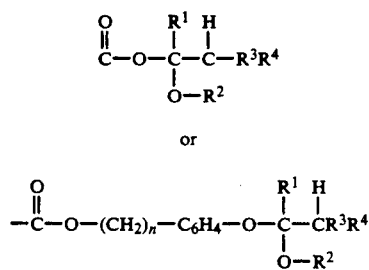

where n is 0 to 4; $R^1$ is hydrogen or lower alkyl; $R^2$ is lower alkyl; and $R^3$ and $R^4$ independently are hydrogen or lower alkyl where the definition of lower alkyl includes alkyl groups having 1 to 6 carbon atoms and the joining of $R^1$ and $R^2$, or $R^1$ and either $R^3$ or $R^4$, or $R^2$ and either $R^3$ or $R^4$ to form a 5-, 6-, or 7-membered ring. Some examples of acid labile monomeric components that fall within the scope of the invention when used to prepare the polymeric material are:

1-ethoxyethyl methacrylate (or acrylate),
1-butoxyethyl methacrylate (or acrylate),
1-ethoxy-1-propyl methacrylate (or acrylate),
tetrahydropyranyl methacrylate (or acrylate),
tetrahydropyranyl p-vinylbenzoate,
1-ethoxy-1-propyl p-vinylbenzoate,
4-(2-tetrahydropyranyloxy)benzyl methacrylate (or acrylate),
4-(1-butoxyethoxy)benzyl methacrylate (or acrylate).

Additional conventional monomer components (having no pendant acid labile groups) which may be used to modify the polymeric material include, but are not limited to, acrylic alkyl esters such as methyl methacrylate; ethyl methacrylate; 2-ethyl hexyl methacrylate; propyl methacrylate; cyclohexyl methacrylate; butyl methacrylate; benzyl methacrylate; benzyl acrylate; methyl acrylate; ethyl acrylate; propyl acrylate; butyl acrylate; styrene; acrylic alkyl amides such as N-butylacrylamide; N-octylacrylamide; acrylonitrile, styrene, p-methyl styrene; butadiene, isoprene. Preferred monomers for resistance to alkaline processing solutions include aromatic monomers such as styrene or benzyl methacrylate or hydrophobic aliphatic monomers such as 2-ethylhexyl, butyl or cyclohexyl methacrylate. Small quantities (typically less than 5 mole %) of glycidal methacrylate may be added as an adhesion promoter.

Photosensitive Acid Generator

Examples of compounds and mixtures which can be used as photoacid generators include diazonium, phosphonium, sulfonium and iodonium salts; halogen compounds; organometal/organohalogen combinations; benzoin and o-nitrobenzyl esters of strong acids, e.g., toluene sulfonic acid; and N-hydroxy amide and N-hydroxyimide sulfonates as disclosed in U.S. Pat. No. 4,371,605. Also included are aryl naphthoquinone-diazide-4-sulfonates. Preferred photosolubilizing agents are the diaryliodonium or triarylsulfonium salts. These are generally present in the form of salts with complex metal halides ions such as tetrafluoroborate, hexafluoroantimonate, hexafluoroarsenate, and hexafluorphosphate.

Another useful group of photosensitive acid generators include oligomers and polymers comprising appended anionic groups having an aromatic onium acid photogenerator as the positive counter ion. Examples of such polymers include those described in U.S. Pat. No. 4,661,429, column 9, lines 1 to 68, and column 10, lines 1 to 14, incorporated herein by reference.

It may be desirable to add a sensitizer to the system to adjust the spectral sensitivity to the available wavelength of actinic radiation. The need will depend on the requirements of system and the specific photosensitive compound used. For example, iodonium and sulfonium salts that only respond to wavelengths below 300 nm may be sensitized to longer wavelengths using benzophenone and derivatives thereof, polycyclic aromatic hydrocarbons such as perylene, pyrene, and anthracene, and derivatives thereof. The decomposition of diaryliodonium and triarylsulfonium salts has also been sensitized by bis-(p-N,N-dimethylaminobenzyliden)-acetone. Anthracene bound sulfonium salts, with chain lengths of three to four atoms, are efficient photosolubilizing agents. These compounds, which are disclosed in M. G. Tilley, Ph.D. Thesis, North Dakota State University, Fargo, N. Dak. (1988) [Diss. Abstr. Int. B, 49, 3791 (1989); Chem. Abstr., 111, 39942u], are a preferred class of photosolubilizing agents. Another preferred acid generator is ATASS, i.e., 3-(9-anthracenyl)propyl-diphenylsulfonium-, hexfluoroantimonate. In this compound the anthracene and the sulfonium salt are bonded by a three carbon chain. Additional examples of acid generator that may be used herein are diphenyliodonium tosylate, benzoin tosylate, and triarylsulfonium hexafluoroantimonate.

The amount of acid generator in the photoresist composition should generally be as low as possible without unduly sacrificing sensitivity, generally from about 0.1% to about 10% by weight of the photoresist composition. Less than about 0.1% generally lead to insensitive compositions while weight percentages greater than about 10% produce compatibility and control problems. For most acid-labile polymers, 0.5 to 6% by weight acid generator in the photoresist composition is preferred.

A sufficient amount of acid labile ester in the polymer is necessary to allow the exposed areas of the resist to be developable in all aqueous base either by dissolution or dispersion. Preferred all aqueous developing solutions include, but are not limited to 0.5% sodium hydroxide or 1.0% sodium carbonate. The addition of small amounts of surfactants or defoamers can be useful to aid development or to control foaming in the solution. The exact amount of acid labile ester depends on the resist formulation, the polymer composition and molecular weight, and the glass transition of both. Experiments have demonstrated that as little as 25 mole % of tetrahydropyranyl methacrylate in a tetrahydropyranyl methacrylate/butyl methacrylate copolymer was sufficient for all aqueous development in 0.5% sodium hydroxide solution.

The Tg of the resist composition has to be adjusted so that it is within a useful range. The resist cannot be excessively tacky or flowable at room temperature at the lower end of the range and yet it must be able to flow at typical lamination temperatures of 100° to 110° C. at the upper end of a temperature range. A preferred range for the glass transition of the composition would be 15° C. to 60° C. The Tg of the polymer would have to fit within that range if it comprises the bulk of the resist although it could be higher providing that it can be plasticized so that the dry film resist falls within that range. Further, it is possible to add other monomers or additives such as polyketals and acetals, plasticizers and/or crosslinkers into the resist composition to modify certain properties.

Colorants

Colorants such as dyes and pigments are useful adjuvants in dry film photoresists because the developed resist image can be inspected for defects and a determination of when the resist has been cleaned from the substrate during development is possible. A preferred example of a colorant is Victoria Green dye. This material imparts a deep green color to a resist and upon exposure of the resist, it lightens in color in the irradiated areas. This creates an image of the artwork which is useful for inspecting the exposed sample for defects that might have been present in the artwork or dirt that accidentally was present during the exposure. Additives that create a visible image by forming a color or by a color change, e.g., leucolactones, would also be useful.

Printed Circuit Manufacture

Photoresists are used in temporary coatings in a primary imaging process to make printed circuits. In practice, a photoresist layer, typically between 8 and 125 microns thick, is applied to a printed circuit substrate which typically is a copper clad fiberglass epoxy board. The applied photoresist layer is then imagewise exposed to actinic radiation to solubilize exposed areas. The exposed areas are then completely removed typically with a developer solution which selectively dissolves, strips or otherwise disperses the exposed areas without adversely affecting the integrity or adhesion of the unexposed areas. The surface areas of the substrate which were uncovered by the development process are then modified by etching or removing material therefrom or depositing a material thereon.

In the instance of primary imaging to form a printed circuit board, the uncovered copper surface areas may be etched or removed to form a printed circuit directly, or additional copper or other metal resistant to etchant, e.g., gold, tin/lead, etc., may be plated thereover. In the first instance, the unexposed resist is typically removed from the remaining copper surface by a stripping process involving re-exposure to actinic radiation followed by a second development operation to form the circuit board directly. In the second instance, the unexposed resist is first removed from the unplated copper surface which is then etched or removed from the substrate to form a plated printed circuit board.

Dry Film Resist Lamination

A pre-formed, dry-film, photosolubilizable resist layer typically is applied from a multi-ply, transfer, resist element using the lamination process as described in U.S. Pat. No. 4,193,797. The multi-ply, resist element comprises, in order, temporary support film, e.g., polyethylene terephthalate, a thin photosolubilizable resist layer, and optionally a removable cover sheet, e.g., polyethylene, to protect the resist element during storage. As described in the patent, the cover sheet, if present, is first removed and the uncovered photoresist surface is laminated to the surface of a copper clad printed circuit substrate using heat and/or pressure, e.g., with a conventional hot-roll laminator. Although the laminate may be imagewise exposed to actinic radiation through the temporary support film, in most instances, where the photoresist layer is insensitive to ambient conditions and is not excessively tacky, the temporary support is removed before imaging to improve resolution and other such properties. In some instances resist adhesion to the substrate can be improved by treating the substrate surface with a liquid at or just prior to lamination such as a solution of adhesion promoters as disclosed in Jones, U.S. Pat. No. 3,645,772 a solvent or swelling agent for the resist layer as disclosed in Fickes. The liquid in some instances may be photosensitive such as the photoresist solutions disclosed in Isaacson, U.S. Pat. No. 3,629,036. The resist may also be applied to the substrate with a vacuum laminator.

TABLE 1

| POLYMER COMPOSITION AND DATA | | | | | | | |
|---|---|---|---|---|---|---|---|
| # | Polymer Composition | Molar % | Prep | $M_w$ | $M_n$ | $T_g$ °C. | $T_d$ °C. |
| 1 | Tetrahydropyranyl methacrylate/butylmethacrylate | 22:78 | GTP | 20,800 | 19600 | 49 | |
| 2 | Tetrahydropyranyl methacrylate/benzylmethacrylate | 50:50 | GTP | 36,000 | 21500 | | 185 |
| 3 | Poly(tert-butyl acrylate) | 100 | | | 100,000 | | |
| 4 | Poly(tert-butylmethacrylate) | 100 | | | 50,000 | | |
| 5 | Novolak Resin HRJ 1829 | | | | | | |
| 6 | THP derivative of HRJ 1829 | | | | | 61 | 148 |
| 7 | Poly(4-(2-tetrahydro-pyranyloxy)benzylmethacrylate) | 100 | GTP | 11,500 | 9,390 | 62 | 251 |
| 8 | Tetrahydropyranyl-methacrylate/benzyl methacrylate methacrylic Acid | 46:51:3 | RADICAL | 183,000 | 58,500 | | |
| 9 | Poly(tetrahydropyranyl-methacrylate) | 100 | GTP | 20,000 | 13,000 | 91 | 174 |
| 10 | Tetrahydropyranyl-methacrylate/block-benzyl | 50:50 | GTP | 36,400 | 23,400 | 80 | 177 |

TABLE 1-continued

POLYMER COMPOSITION AND DATA

| # | Polymer Composition | Molar % | Prep | $M_w$ | $M_n$ | $T_g$ °C. | $T_d$ °C. |
|---|---|---|---|---|---|---|---|
| | methacrylate | | | | | | |
| 11 | 2-Tetrahydrofuranyl-methacrylate/benzyl methacrylate | 50:50 | GTP | 12,300 | 10,200 | 80 | 187 |
| 12 | Tetrahydropyranyl-methacrylate/benzyl methacrylate | 40:60 | GTP | 26,100 | 17,300 | 70 | 187 |
| 13 | Tetrahydropyranyl-methacrylate/2-ethylhexyl methacrylate/benzylmethacrylate | 33:40:27* | GTP | 25,800 | 13,800 | 58 | 189 |
| 14 | Tetrahydropyranyl-methacrylate/2-ethylhexyl methacrylate/benzylmethacrylate | 39:32:29* | GTP | 27,000 | 14,900 | 68 | 194 |
| 15 | Ethoxypropyl-methacrylate/benzyl methacrylate | 50:50 | RADICAL | 54,700 | 21,200 | 58 | 196 |

* wt. %

In the following preparations, gel permeation chromatography (GPC) is used with polystyrene standards for molecular weight measurements. Differential scanning calorimetry is abbreviated DSC. Procedures for carrying out group transfer polymerizations (drying of apparatus, purification of monomers) are as described in Sogah, D. Y.; Hertler, W. R.; Webster, O. W.; Cohen, G. M. *Macromolecules* 1987, 20, 1473.

POLYMER #1

Poly(n-butyl methacrylate (78 mole %) THPMA (22 mole %))

Tetrahydropyranyl methacrylate (THPMA) and n-butyl methacrylate were purified separately by passage over a column of basic alumina under argon. To a solution of 1.48 mL (5 mmol) of 1-(2-trimethylsiloxyethoxy)-1-trimethylsiloxy-2-methyl-1-propene and 0.1 mL of tetrabutylammonium biacetate (0.04M in THF) in 150 mL of THF under an argon atmosphere was added a mixture of 64.1 g (71.7 mL, 0.45 mol), of n-butyl methacrylate and 21.6 g (21.2 mL, 0.127 mol) of THPMA at a rate such that the temperature of the reaction remained between 35° and 40° C. NMR analysis of the reaction mixture showed no residual monomer. Precipitation in methanol gave an oil, which, after drying at 0.1 mm, solidified to 60 g of poly(n-butyl methacrylate [78 mol %], THPMA [22 mol %]). GPC: $M_n=19,600$, $M_w=20,800$, $M_w/M_n=1.11$. DSC: $T_g=49.2°$ C.

POLYMER #2

Preparation of 1:1 Random Copolymer of Tetrahydropyranyl Methacrylate and Benzyl Methacrylate by Group Transfer Polymerization To a solution of 0.45 mL (2.5 mmol) of 1-(2-trimethylsiloxyethoxy)-1-trimethylsiloxy-2-methyl-1-propene (TTEB) and 0.4 μL of tetrabutylammonium biacetate hexahydrate (0.005M in tetrahydrofuran) in 75 mL of tetrahydrofuran (THF) under argon was added a mixture of 15 mL (14.78 g, 0.084 mol) of benzyl methacrylate and 14 mL (14.28 g, 0.084 mol) of THPMA at a rate such that the temperature did not exceed 36° C. Both monomers had been individually passed over columns of basic alumina under an argon atmosphere just prior to use. NMR analysis of an aliquot of the reaction mixture showed 8% residual monomer. The product was precipitated in methanol and dried at room temperature to give 29.7 g of poly(THPMA-co-benzyl methacrylate). GPC: $M_n=21,500$, $M_{32}=36,000$, $M_wM_n=1.67$ (polystyrene standard). NMR analysis of the copolymer shows the composition to be 1:1 on a molar basis.

POLYMER #3

Poly(tert-butyl acrylate), 35% in toluene purchased from Monomer-Polymer Laboratories, Trevose, Pa. 19047.

POLYMER #4

Poly(tert-butyl methacrylate) purchased from Monomer Polymer Laboratories.

POLYMER #5

Phenolic Novolak Resin HRJ 1829, Novolak for flexible photoresist, mp 140° C. obtained from Schenectady Chemicals, Inc., Schenectady, N.Y.

POLYMER #6

Preparation of tetrahydropyranyl Novolak HRJ 1829

A mixture of 5.09 g of Novolak HRJ-1829, 20 mL of 3,4-dihydro-2H-pyran, and 0.1 g of pyridine hydrochloride was stirred at reflux for 18 hr. Then 1 g of cross-linked poly(dimethylaminomethylstyrene) was added, and the mixture was stirred for 1 hr and filtered. Precipitation of the product from the filtrate with methanol gave, after drying in vacuo at room temperature, 6.5 g of tetrahydro-2-pyranyl ether of Novolak resin. $^1$H NMR (300 MHz) shows a resonance at δ 5.35 ppm characteristic of the methine proton of a tetrahydropyranyl ether. DSC: $T_g$ 60.8° C. with decomposition endotherm at 148.09° C. (335.6 J/g). TGA shows 29.45% weight loss at 161.95° C.

POLYMER #7

Poly(4-tetrahydropyranyloxybenzyl methacrylate)

To a solution of 0.64 mL (2 mmol) of 1-(2-trimethylsiloxyethoxy)-1-trimethylsiloxy-2-methyl-1-propene, 0.55 mL of tetrabutylammonium biacetate (0.04M in THF), and 0.06 mL of bis(dimethylamino)methylsilane in 40 mL of THF was added dropwise a solution of 20 g (72.5 mmol) of 4-tetrahydropyranyloxybenzyl methacrylate (purified by passing over a column of basic alumina in hexane solution, followed by evaporation of the hexane under reduced pressure) in 30 mL of THF. When the exothermic polymerization was finished, and the temperature had returned to room temperature, the reaction mixture was poured into methanol. Filtration gave 19 g of poly(4-tetrahydropyranyloxybenzyl methacrylate). GPD: $M_n=9390$, $M_{32}=11,500$, $M_wM_n=1.23$.

DSC: $T_g = 62.3°$ C., with a decomposition endotherm at 250.5° C. TGA: rapid loss of 24.74% of weight at 248.1° C. The monomer was prepared from methyl 4-hydroxybenzoate by reaction with an excess of 3,4-dihydro-2H-pyran in the presence of sulfuric acid catalyst to give methyl 4-(2-tetrahydropyranyloxy)benzoate, which was then reduced with lithium aluminum hydride in THF solution to give 4-(2-tetrahydropyranyloxy)benzyl alcohol. Esterification with methacrylyl chloride and triethylamine in dichloromethane solution gave 4-tetrahydropyranyloxybenzyl methacrylate, m.p. 36° C.

POLYMER #8

Poly(benzyl methacrylate [51 mol %]-co-tetrahydropyranyl methacrylate [46 mol %]-co-methacrylic acid [3 mol %])

A solution of 24.4 mL (0.141 mol) of benzyl methacrylate, 23.4 mL (0.141 mol) of THPMA, and 75 mg of azobis(isobutyronitrile) (VAZO 64) was heated at 75° C. under argon for 7 hr, during which time the solution became viscous. An additional 75 mg of VAZO 64 (dissolved in 5 mL of ethyl acetate) was added, and heating at 75° C. was continued for 5 hr. NMR analysis of the solution showed about 8.5% residual monomer(s). The product was isolated by precipitation in methanol. Titration of an aliquot of the product with standard sodium hydroxide solution showed 0.18 meq/g of methacrylic acid units in the polymer. Thus, the product is poly(THPMA [46 mol %]-co-benzyl methacrylate [51 mol %]-co-methacrylic acid [3 mol %]). GPC: $M_n = 58,500$, $M_w = 183,000$, $M_w/M_n = 3.13$.

POLYMER #9

Poly(2-tetrahydropyranyl methacrylate)

To a solution of 0.15 mL (0.5 mmol) of 1(2-trimethylsiloxyethoxy)-1-trimethylsiloxy-2-methyl-1-propene and 30 µL of tetrabutylammonium biacetate (0.04M in THF) in 30 mL of THF was added dropwise 10 g (9.8 mL, 58.8 mmol) of tetrahydropyranyl methacrylate (purified by passage over a column of basic alumina under an argon atmosphere). NMR analysis of the reaction mixture showed that there was no residual monomer. Precipitation with methanol gave 8.34 g of poly(2-tetrahydropyranyl methacrylate). GPC: $M_n = 13,600$, $M_w = 20,000$, $M_w/M_n = 1.47$.

POLYMER #10

Poly(2-tetrahydropyranyl methacrylate-b-benzyl methacrylate)

To a solution of 0.925 mL (2.9 mmol) of 1-(2-trimethylsiloxyethoxy)-1-trimethylsiloxy-2-methyl-1-propene and 62.5 µL of tetrabutylammonium biacetate (0.04M in THF) in 100 mL of THF was added dropwise 30.6 g (30 mL, 174 mmol) of 2-tetrahydropyranyl methacrylate at a rate such that the temperature remained between 35° and 40° C. Four minutes after the temperature first began to drop following the addition of the 2-tetrahydropyranyl methacrylate, the addition of 31.8 g (31.25 mL, 174 mmol) was begun. After the addition was complete, NMR analysis of an aliquot of the reaction mixture showed that no residual monomer was present. Precipitation with methanol gave 62 g of poly(2-tetrahydropyranyl methacrylate-b-benzyl methacrylate). GPC: bimodal with 17% having $M_n = 7990$, $M_{32} = 8680$, $M_w/M_n = 1.09$, and 83% having $M_n = 41,400$, $M_w = 42,100$, $M_w/M_n = 1.02$. DSC: $T_g = 80.3°$ C. with decomposition endotherm at 176.9° C. $^1$H-NMR analysis of the product shows that the composition is 1:1 tetrahydropyranyl methacrylate:benzyl methacrylate.

POLYMER #11

Poly(2-tetrahydrofuranyl methacrylate-co-benzyl methacrylate)

To a solution of 0.74 mL (2.5 mmol) of 1-(2-trimethylsiloxyethoxy)-1-trimethylsiloxy-2-methyl-1-propene and 175 µL of tetrabutylammonium biacetate (0.04M in THF) in 75 mL of THF was added dropwise a mixture of 25.4 g (25.0 mL, 145 mmol) of benzyl methacrylate and 22.6 g (21.3 mL, 145 mmol) of 2-tetrahydrofuranyl methacrylate. Analysis of an aliquot of the reaction mixture showed the presence of residual monomers. Precipitation with methanol gave 19.3 g of poly(2-tetrahydrofuranyl methacrylate-co-benzyl methacrylate). $^1$H-NMR analysis of the polymer showed the molar composition to be 1:1 tetrahydrofuranyl methacrylate:benzyl methacrylate. GPC: $M_n = 10,200$, $M_{32} = 12,300$, $M_w/M_n = 1.20$. DSC: $T_g = 80.4°$ C. with a broad, complex decomposition endotherm of 182.8°–251° C. TGA: 16.3% weight loss at 186.7° C.

POLYMER #12

Poly(tetrahydropyranyl methacrylate [40 mol %]-co-benzyl methacrylate [60 mol %])

To a solution of 0.78 mL (2.46 mmol) of 1-(2-trimethylsiloxyethoxy)-1-trimethylsiloxy-2-methyl-1-propene and 700 µL of tetrabutylammonium biacetate (0.04M in THF) in 130 mL of THF was added dropwise a mixture of 19.6 g (19.2 mL, 115.6 mmol) of tetrahydropyranyl methacrylate and 30.5 g (30.0 mL, 173.4 mmol) of benzyl methacrylate at a rate such that the temperature remained near 45° C. during the addition. Precipitation with methanol gave 50 g of poly(tetrahydropyranyl methacrylate-co-benzyl methacrylate). $^1$H-NMR analysis of the product shows the composition to be 40 mole % tetrahydropyranyl methacrylate, 60 mole % benzyl methacrylate. GPC: $M_n = 17,300$, $M_{32} = 26,100$, $M_w/M_n = 1.51$. DSC: $T_g = 70.1°$ C. with a decomposition endotherm at 186.9° C. TGA: 16.02% weight loss at 184.4° C.

POLYMER #13

Poly(tetrahydropyranyl methacrylate [33 wt %]-co-2-ethylhexyl methacrylate [40 wt %]-co-benzyl methacrylate [27 wt %])

THPMA, 2-ethylhexyl methacrylate, and benzyl methacrylate were purified by passage over a column of basic alumina under argon. To a solution of 0.44 mL (1.5 mmol) of 1-(2-trimethylsiloxyethoxy)-1-trimethylsiloxy-2-methyl-1-propene and 0.08 mL of tetrabutylammonium biacetate (0.04M in THF) in 100 mL of THF was added a mixture of 9.9 g (9.7 mL, 58.2 mmol) THPMA, 12 g (13.6 mL, 60.6 mmol) of 2-ethylhexyl methacrylate, and 8.1 g (8.2 mL, 46 mmol) of benzyl methacrylate at a rate such that the temperature remained below 30° C. When the monomer mixture had been added, addition of 0.03 mL of tetrabutylammonium biacetate (0.04M in THF) resulted in a temperature rise of 7° C. NMR analysis of the reaction mixture showed the presence of a trace of unreacted monomers. Successive precipitation in methanol and in hexane cooled at −78° C. followed by drying gave 23.1 g of solid poly(THPMA [33 wt %]-co-2-ethylhexyl methacrylate [40 wt %]-co-benzyl methacrylate [27 wt %]). GPC: $M_n=13,800$, $M_{32}=25,800$, $M_w/M_n=1.87$. DSC: $T_g=57.6°$ C. with a decomposition endotherm peaking at 188.9° C.

POLYMER #14

Poly(tetrahydropyranyl methacrylate [39 wt %]-co-2-ethylhexyl methacrylate [32 wt %]-co-benzyl methacrylate [29 wt %])

Tetrahydropyranyl methacrylate (11.7 g), 9.6 g of 2-ethylhexyl methacrylate, and 8.7 g of benzyl methacrylate were polymerized using the general procedure used for polymer #13 (with precipitation in cold methanol) to give 25.5 g of poly(THPMA [39 wt %], 2-ethylhexyl methacrylate [32 wt %], benzyl methacrylate [25 wt %]). GPC: $M_n=14,900$, $M_w=27,000$, $M_w/M_n=1.81$. DSC: $T_g=67.7°$ C. with a decomposition endotherm peaking at 194.1° C.

POLYMER #15

Poly(1-ethoxypropyl methacrylate-co-benzyl methacrylate)

To a refluxing mixture of 150 mL of deoxygenated ethyl acetate, 25.43 g (144.5 mmol) of benzyl methacrylate, and 24.89 g (144.5 mmol) of 1-ethoxypropyl methacrylate (prepared by the acid-catalyzed reaction of ethyl 1-propenyl ether and methacrylic acid) under argon, was added 0.15 g of azobis(isobutyronitrile). After refluxing for 8 hr, the solution was treated with an additional 0.15 g of azobis(isobutyronitrile), and refluxing was continued for 18 hr. NMR analysis of the reaction mixture showed the presence of 4% unreacted monomers. Precipitation in methanol gave 49.4 g of poly(1-ethoxypropyl methacrylate-co-benzyl methacrylate). $^1$H-NMR analysis of the product shows the composition to be 1:1 1-ethoxypropyl methacrylate:benzyl methacrylate. GPC: $M_n=21,200$, $M_w=54,700$, $M_w/M_n=2.57$. DSC: $T_g=58.1°$ C. with a decomposition endotherm at 195.5° C. TGA: 19.8% weight loss at 187.7° C.

| Initiators | |
|---|---|
| Initiator #1 | Cyracure 6974 manufactured by Union Carbide |
| Initiator #2 | Benzoin Tosylate obtained from Ciba Geigy |
| Initiator #3 | Dimethyl-2-(4-hydroxynaphthyl-sulfonium hexafluorophosphate |
| REF: | prepared in accordance with the general procedure described in J. V. Crivello and H. J. W. Lam, J. Poly. Sci., Polym. Chem. Ed., 18, 1021, (1980). |
| Initiator #4 | [3-(9-anthracenyl)propyl] diphenylsulfonium hexafluoroantimonate |
| Ref: | Mark Gerard Tilley, North Dakota State University PhD Thesis, "Synthesis and Reactivity of Cationic Photoinitiators and Translational Diffusion of Small Molecules in Polymers, October, 1988. |

Procedure for Treatment of Copper Clad Panels with Benzotriazole

A solution was prepared comprising 385 grams of deionized water, 47.5 grams of 37% hydrochloric acid, and 47.5 grams of benzotriazole. A working solution was prepared by mixing one part of this solution to 9 parts of deionized water.

The copper-clad glass epoxy panels were scrubbed and dried. They were dipped for 15 seconds into the working benzotriazole solution, rinsed for 30 seconds in a stream of deionized water, and dried in oil free air. The panels are then ready to laminate with resist.

To further illustrate the present invention the following examples are provided.

EXAMPLES

Example 1

Two photoresist coating solutions 1A 1B, and 1C were prepared with the ingredients as listed below:

| | 1A | 1B |
|---|---|---|
| Polymer #1 [poly(THPMA/ButylMA)] | 1.5 g | |
| Polymer #2 [poly(THPMA/BenzylMA)] | | 1.5 |
| Cyracure 6974 | 0.1 g | 0.1 g |
| Chlorothioxanthone | 0.01 g | 0.01 g |
| Benzophenone | 0.24 g | 0.24 g |
| Dibutylphthalate | | 0.20 g |
| Victoria Green Dye | 0.001 g | 0.001 g |
| Methylethylketone | 3.0 g | 3.0 g |

Dry Film Resist

Solution 1A, prepared with a copolymer of tetrahydropyranyl methacrylate and n-butyl methacrylate, was coated onto 92 gauge polyester film and air dried to give a green resist film 1 mil thick. The coating was then laminated to a scrubbed copper clad epoxy panel at 105° F. and 2 fpm using a Du Pont HRL hot roll laminator. On a sample of the panel different areas were given exposures of 50, 100, 200, 400 and 600 mj/cm$^2$ using a Du Pont PC 130 printer (containing a 5000 W Sylvania M061 lamp). The exposures were held 15 minutes at room temperature prior to being developed in a 0.5% aqueous sodium hydroxide solution at 105° F. in an ASI spray developer unit at 30 psi. The exposure energy incident upon the samples was checked with an IL 770 radiometer which integrated energy between 300 and 400 nanometers. The 200 mj/cm$^2$ and higher exposures allowed the resist to be developed at 150 seconds. Another sample was exposed imagewise at 200 mj/cm$^2$ through a UGRA Plate Control Wedge 1982 containing concentric circles spaced from 4 to 70 microns (available from the Graphic Arts Technical Foundation) and held 15 minutes at room temperature. The green color in those areas which had received exposure was substantially faded, providing a crisp bleach out image of the artwork. The developed sample held and resolved 55 micron lines and spaces and the edges of the image lines were even and well formed.

Solution 1B was prepared using a copolymer of tetrahydropyranyl methacrylate and benzyl methacrylate. A one mil dry film was coated and laminated to scrubbed copper clad glass epoxy which had been previously scrubbed and treated with a benzotriazole solution as described in the procedure for treatment of copper clad glass epoxy with benzotriazole. On a sample of the panel different areas were given exposures of 100, 200, 300, 400 and 800 mj/cm$^2$, held for 30 minutes at room temperature, and developed in a beaker of 0.5% sodium hydroxide at 105° F. The 400 mj exposure developed clean at 290 seconds and the 800 mj exposure at 47 seconds. No heat was required. At exposures of 200 mj/cm$^2$ and 400 mj/cm$^2$ the resist developed in the same solution in the ASI 30 psi spray developer at 60 seconds and 7 seconds respectively.

Comparative Example

Two photoresist coating solutions 2A and 2B were prepared with the ingredients listed below:

|  | 2A | 2B |
| --- | --- | --- |
| Polymer #3 [poly(t-butyl acrylate)] | 1.5 g |  |
| Polymer #4 [poly(t-butyl methacrylate)] |  | 1.5 g |
| Cyracure 6974 | 0.1 g | 0.1 g |
| Chlorothioxanthone | 0.002 g | 0.002 g |
| Benzophenone | 0.24 g | 0.24 g |
| 2-Methoxypropane | 3.0 g |  |
| Methylethylketone |  | 3.0 g |

Dry Film Resist

Solution 2A, prepared with poly(t-butyl acrylate), was coated onto 92 gauge polyester film with a six mil doctor knife and air dried to give a film 1 mil thick. One part of this coating was laminated to a panel of scrubbed copper clad epoxy laminate at 105° C. at 2 fpm; another part was laminated to a panel of laminate which had been previously scrubbed and treated with a benzotriazole solution as described in Example 1. The polyester was removed and different areas of each sample were given separate exposures of 600, 1200 and 2400 mj/cm$^2$ as indicated in the table below. One sample at each exposure was placed in a 100° C. oven for two minutes and then held for an additional 13 minutes prior to development. The other sample at each exposure was placed in the 100° C. oven for 15 minutes. All of the samples were subjected to spray development in an ASI unit with 0.5% sodium hydroxide solution at 105° F. and 30 psi spray pressure until they developed clean (as determined by a brief etch in acidic ammonium persulfate) or for a maximum contact time of 10 minutes. The times to develop cleanly are summarized in the table (DNC means incomplete development which left resist on the copper).

TABLE

|  | Comparative Example | | | | | |
| --- | --- | --- | --- | --- | --- | --- |
|  | Coating on copper | | | Coating on treated copper | | |
| Exp. | 600 mj | 1200 mj | 2400 mj | 600 mj | 1200 mj | 2400 mj |
| 2 min. in oven | DNC | DNC | DNC | DNC | DNC | 120 sec |
| 15 min. in oven | DNC | DNC | 120 sec | 120 sec | 120 sec | 120 sec |

Samples of coating 2A laminated to the treated copper were imagewise exposed through the UGRA target at 600 and 1200 mj/cm$^2$, heated for 15 minutes at 100° C. and developed for 130 seconds in the ASI spray developer. Although both images held and resolved 55 micron lines, the developed edges of isolated lines were uneven and ragged.

Liquid Resist

Solution 2B, prepared with poly(t-butylmethacrylate), was coated onto 92 gauge polyester to give a very brittle coating which shattered. To test the resist, solution 2B was coated directly onto a panel of scrubbed copper clad epoxy laminate with a six mil doctor blade, air dried, and further dried in a 40° C. oven for 15 minutes to give a coating one mil thick. An exposure of 600 mj/cm$^2$ followed by heating at 100° C. for 15 minutes allowed this resist to be developed clean in 150 seconds under the conditions previously cited. The edges of isolated lines on an imaged sample produced under these conditions were uneven and ragged.

Comparative Example

Three photoresist coating solutions 3A, 3B and 3C were prepared with the ingredients listed below. Polymers 5 and 6 are included for comparison. Polymer 7 is within the invention.:

|  | 3A | 3B | 3C |
| --- | --- | --- | --- |
| Polymer #5 [Novolak Resin HRJ1829)] | 1.5 g |  |  |
| Polymer #6 [THP derivative of HRJ1829)] |  | 1.5 g |  |
| Polymer #7 [poly(4-(2-THPoxy)benzylMA)] |  |  | 1.5 g |
| Cyracure 6974 | 0.1 g | 0.1 g | 0.2 g |
| Chlorothioxanthone | 0.002 g | 0.002 g | 0.002 g |
| Benzophenone | 0.24 g | 0.24 g | 0.24 g |
| Dibutylphthalate | 0.2 g | 0.2 g | 0.2 g |
| Victoria Green Dye | 0.001 g | 0.001 g | 0.001 g |
| Methylethylketone | 3.0 g | 3.0 g | 3.0 g |

Liquid Coating

Solution 3A was coated onto a piece of scrubbed copper clad glass epoxy with a six mil doctor blade, air dried, and fully dried in a 40° C. oven for 15 minutes to give a coating one mil thick. A sample was passed through the ASI developer unit with 0.5% sodium hydroxide at 105° F., but the coating would not wash clean after 10 minutes. Another sample was dipped into a stirred beaker with a 50/50 vol/vol solution of Shipley Microposit 351 (essentially 5% sodium hydroxide) and DI water at 105° F. The coating developed from the panel in 60 seconds. A third sample developed clean in 19 seconds when placed in a semi-aqueous developer solution at 105° F. comprising 70 grams of n-propyl alcohol, 128 grams of water, and 2 grams of potassium hydroxide.

Dry Film Resist

A second sample of HRJ1829 was converted to its tetrahydropyranyl ester derivative using dihydropyran (Polymer #6). A coating solution 3B was prepared identical to 3A, except that the tetrahydropyranyl derivative replaced the HRJ1829 polymer; the solution was coated onto one mil polyester with a six mil doctor blade and air dried to give a one mil thick dry film resist. This photosensitive coating was laminated onto scrubbed and treated copper clad epoxy laminate with a hot roll laminator. Samples of the coating were given separate exposures of 100, 200, 400 and 800 mj/cm$^2$ and held for thirty minutes. During the hold time they received different heat treatments as listed in Table 3 below. The samples were immersed in all aqueous and semi-aqueous developer until the resist cleaned from the copper or for a maximum of 5 minutes. Note that this resist would only develop in semi-aqueous developer and then only after extensive heating.

TABLE 3

| Developer/ Temp | Hold Temp/ Time | 100 mj/cm$^2$ | 200 mj/cm$^2$ | 400 mj/cm$^2$ | 800 mj/cm$^2$ |
|---|---|---|---|---|---|
| 351/H$_2$O 50/50 105° F. | RT | DNC | sl. dev | heavy residue | heavy residue |
| | 100° C./ 5 min. | DNC | sl. dev | heavy residue | heavy residue |
| | 100° C./ 15 min. | DNC | DNC | heavy residue | heavy residue |
| Semi-Aqueous 105° C. | RT | DNC | heavy residue | heavy residue | heavy residue |
| | 100° C./ 5 min. | DNC | heavy residue | heavy residue | heavy residue |
| | 100° C./ 15 min. | DNC | scum | 210 sec | 45 sec |

Two samples of coating 3B were imagewise exposed through the UGRA artwork at 400 and 800 mj/cm$^2$, held 15 minutes, heated for 15 minutes at 100° C., and developed in the semi-aqueous developer at 105° F. The images developed cleanly, but the line edges were ragged and uneven.

Dry Film Resist

For comparison, a one mil dry film was coated on 92 gauge polyester from solution 3C containing poly(4-(tetrahydropyranyloxy)-benzyl methacrylate) which is within the present invention, dried, and laminated to scrubbed and treated copper clad glass epoxy. An exposure of 200 mj/cm$^2$ allowed to resist to develop 50/50 Shipley Microposit 351 developer solution in 25 seconds at 105° F. The unexposed resist remained glossy. Unlike the resist containing tetrahydropyranyl derivative of the Novalak resin, this resist did not require heating after exposure and it developed in all aqeuous alkali. A sample imaged through a UGRA target at 200 mj/cm$^2$ and developed at 25 seconds in the same developer held 70 micron lines.

Example 4

Four photoresist coating solutions 4A, 4B, 4C and 4D were prepared with the ingredients listed below:

| | 4A | 4B | 4C | 4D |
|---|---|---|---|---|
| Polymer #2 | 1.5 g | 1.5 g | 1.5 g | 1.5 g |
| Cyracure 6974 | 0.1 g | | | |
| Chlorothioxanthone | 0.002 g | | | |
| Benzoin Tosylate | | 0.05 g | | |
| Initiator #3 | | | 0.1 g | |
| Initiator #4 | | | | 0.05 g |
| Benzophenone | 0.24 g | 0.24 g | 0.24 g | 0.24 g |
| Dibutylphthalate | 0.2 g | 0.2 g | 0.2 g | 0.20 g |
| Victoria Green Dye | 0.001 g | 0.001 | 0.001 g | 0.001 g |
| Methylisobutylketone | 3.0 g | 3.0 g | 3.0 g | 3.0 g |

These solutions were coated onto one mil polyester with a six mil doctor blade and air dried to give one mil thick dry film resists. These were laminated onto scrubbed and benzotriazole treated copper clad epoxy laminate with a hot roll laminator. The green color of all four resists was bleached on exposure, providing a visible reproduction of the artwork in the resist. Resist 4A was given a 100 mj/cm$^2$ exposure, held 30 minutes at room temperature, and developed for 13 seconds to a step 2 (step density 0.15) after development for 13 seconds in 0.5% sodium hydroxide spray as previously described. Resist 4B developed to a step 2 at an exposure of 564 mj/cm$^2$ and a development time of 18 seconds. Resist 4C developed to a step 3 after a 400 mj/cm$^2$ exposure and a development time of 13 seconds. Resist 4D developed in 15 seconds with a 100 mj/cm$^2$ exposure.

A sample of each of the laminated resists 4A, 4B and 4C were exposed through a fine line and space target and developed as indicated above. The samples were etched in ammonical cupric chloride, pH 8.4, s.g. 2.2, at 130° F. and 38 psi in a Chemcut spray etcher. The etched samples held isolated 55 micron etched lines and resolved 25 micron etched channels. The resist on these samples was then stripped by giving them 4 joules of UV exposure on a conveyorized exposure source, heating for 60 seconds at 160° C. on a conveyorized infrared unit, and passing them through the original spray developer for 60 seconds.

Example 5

A sample of resist 4A from Example 4 was imaged with pads and developed as in the previous example. The sample was precleaned in a sodium persulfate/sulfuric acid bath for 60 seconds, followed by 10 seconds in 10% sulfuric acid and another 10 seconds in fluoboric acid. It was then plated for 15 minutes in a tin/lead fluoborate bath at 10 amps per square foot. The sample was then reimaged at 500 mj/cm$^2$ with a line pattern that intersected the plated pads and developed. The reimaged sample was etched in ammonical cupric chloride and stripped as previously described to give a sample with solder plated pads and copper conductors.

Example 6

A sample of resist 1B was imaged with a fine line and space target as described in Example 4 and precleaned in a sodium persulfate/sulfuric acid solution. The sample was placed into a PCK-570 full build electroless copper bath at 72° C. and pH 12. The bath was replenished with formaldehyde and sodium hydroxide as needed over a period of 7½ hours to keep the bath actively depositing electroless copper in the developed channels of the resist where the copper cladding of the laminate had been uncovered. At the end of the time the resist had not blistered or lifted. The sample was dipped into warm sulfuric acid for 30 seconds and given 2 joules of UV exposure. The bulk of the resist was removed after 5 minutes in the ASI spray processor with 0.5% sodium hydroxide after 5 minutes.

Example 7

Resist solution 7A was prepared by dissolving grams of Polymer #8 prepared by free radical polymerization, 0.4 grams of dibutyl phthalate, 0.48 grams of benzophenone, 0.004 grams of chlorothioxanthone, 0.2 grams Cyracure 6974, and 0.002 grams of Victoria Green dye into six grams of methylethyl ketone. A coating was drawn on 92 gauge polyester with a six mil doctor knife to give a 0.8 mil thick dry film resist after drying. Another coating was drawn with a 10 mil knife to give a resist 1.8 mils thick. These coatings were laminated to scrubbed copper clad epoxy laminate. The thinner resist developed clean at 12 seconds after an exposure 200 mj/cm$^2$; the thicker resist developed clean in 15 seconds after an exposure of 400 mj/cm$^2$. These resists were laminated to both sides of scrubbed copper clad epoxy panels over a pattern of through holes in the laminate which were 34 mils and 96 mils in diameter. After passing through a 0.5% sodium hydroxide solution at 105° F. in an ASI spray developer at 30 psi spray pressure top and bottom for 15 seconds, the panel with the 0.8 mil resist had 99% of the 34 mil tents intact. On the 1.8 mil resist, after 120 seconds under the same conditions, 80% of the 96 mil tents survived.

Example 8

Solutions were prepared by dissolving 1.5 grams of the polymers in Table 5 below into 3 grams of methylethyl ketone and coating the solution onto 92 gauge polyester with a six mil knife and air drying. An attempted lamination was then made with each of these coatings in the standard fashion for a dry film resist, they were passed through the nip of a Du Pont HRL hot roll laminator set at 105° C. at 2 fpm. along with a scrubbed piece of copper clad glass epoxy. The results of this trial, summarized in Table 5, indicate that the $T_g$ of the coating must be below 60° to 70° C. for a proper lamination of the resist.

TABLE 5

| Polymer** | $T_g$ | Lamination Result |
|---|---|---|
| Polymer #2 | 97° C. | Would not laminate, very brittle and badly cracked |
| Polymer #8 | 97° C. | Would not laminate |
| Polymer #9 | 91° C. | Would not laminate, very brittle and badly cracked |
| Polymer #10 | 80° C. | Only partial lamination, badly cracked |
| Polymer #11 | 80° C. | Laminated, but cracked |
| Polymer #12 | 70° C. | Mostly laminated, but cracked |
| Polymer #14 | 68° C. | Laminated, no cracks, but air entrapment* |
| Polymer #13 | 58° C. | Laminated, no cracks, air entrapment |
| Polymer #15 | 58° C. | Good lamination |
| Polymer #1 | 49° C. | Good lamination |

*Air entrapment is the condition where pockets of air are trapped at the interface of the resist and the uneven surface of the copper because of insufficient flow of the resist film at lamination
**All of the above polymers are within the invention but results identify preferred ranges of $T_g$ for lamination As many differing embodiments of this invention may be made without departing from the spirit and scope thereof, it is to be understood that this invention is not limited to the specific embodiments except as defined in the appended claims.

Having described the invention, we now claim the following and their equivalents.

What is claimed is:

1. A process for forming a positive photoresist on a surface which comprises:
   a. applying to said surface the surface of a solid, unexposed, photosensitive layer having a thickness of at least 8 microns, said layer comprised of (a) a polymer chosen from the group consisting of compositions having a polymer backbone and pendant acid-labile groups which are bound directly or indirectly to the polymer backbone, said pendant acid-labile groups represented by the formula:

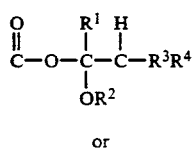

or

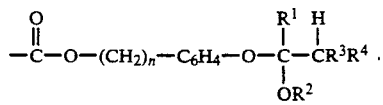

where n=0-4; $R^1$ is hydrogen or lower alkyl; $R^2$ is lower alkyl; and $R^3$ and $R^4$ independently are hydrogen or lower alkyl where the definition of lower alkyl includes the joining of $R^1$ and $R^2$ or $R^1$ and either $R^3$ or $R^4$, or $R^2$ and either $R^3$ or $R^4$ to form a 5-, 6-, or 7-membered ring; (b) an initiator system that forms a catalytic amount of strong acid upon exposure to actinic radiation having a wavelength between about 3000 Å and about 9000 Å; and the other surface of the layer having adhered thereto with low to moderate adherence a thin, flexible, polymeric film support; then
   b. exposing the layer, imagewise, to actinic radiation to form an image,
   c. stripping the film support from the resulting image-bearing layer; and then,
   d. washing away the exposed areas of the layer to form a positive resist image,
   e. permanently modifying the adjacent areas on the substrate surface which are unprotected by the resist image by using a reagent capable of etching said areas or depositing a material on said areas; and
   f. blank exposing the resist image and stripping it from the resist in aqueous alkali.

2. The process of claim 1 wherein the photosensitive layer contains a plasticizer.

3. The process of claim 1 wherein the photosensitive layer contains a colorant.

4. The process of claim 1 wherein the photosensitive layer contains an adhesion promoter.

5. The process of claim 1 wherein the photosensitive layer contains a surfactant.

6. The process of claim 1 wherein the polymer is selected from a homopolymer, copolymer, terpolymer and block polymer.

7. The process of claim 6 wherein the polymer is a copolymer benzyl methacrylate and tetrahydropyranyl methacrylate.

8. The process of claim 6 where an acid labile monomer used to form said polymer is selected from the group comprising:
1-ethoxyethyl methacrylate,
1-ethoxyethyl acrylate
1-butoxyethyl methacrylate,
1-butoxyethyl acrylate,
1-ethoxy-1-propyl methacrylate,
1-ethoxy-1-propyl acrylate,
tetrahydropyranyl methacrylate,
tetrahydropyranyl acrylate,
tetrahydropyranyl p-vinylbenzoate,
1-ethoxy-1-propyl-p-vinylbenzoate,
4-(2-tetrahydropyranyloxy)benzyl methacrylate,
4-(2-tetrahydropyranyloxy)benzyl acrylate,
4-(1-butoxyethoxy)benzyl methacrylate, and
4-(1-butoxyethoxy)benzyl acrylate.

9. The process of claim 6 wherein the polymer contains one or more comonomers having no pendant acid-labile groups.

10. The process of claim 9 wherein the polymer having no pendant acid-labile groups is selected from the group comprising: methyl methacrylate, butyl methacrylate, benzyl methacrylate, benzyl acrylate, styrene, 2-ethylhexyl methacrylate, and cyclohexyl methacrylate.

11. The process of claim 6 wherein the polymer is prepared by group transfer polymerization.

12. The process of claim 6 wherein the polymer is prepared by free radical polymerization.

13. The process of claim 6 wherein the initiator system contains an acid generator selected from diazonium, phosphonium, sulfonium, iodonium salts, halogen compounds, organometal/organohalogen combinations, benzoin esters and o-nitrobenzyl esters of strong acids, and N-hydroxyamide and N-hydroxyimide sulfonates, and aryl naphthoquinonediazide-4-sulfonates.

14. The process of claim 6 wherein the acid generator comprises about 0.1% to about 10% by weight of the photoresist composition.

15. A process for forming a positive resist on a surface which process comprises:
   a. applying to said surface the surface of a solid, unexposed, photosensitive layer having a thickness of about 8 microns, said layer comprised of (a) a polymer chosen from the group consisting of compositions having a polymer backbone and pendant acid-labile groups which are bound directly or indirectly to the polymer backbone, said pendant acid-labile groups represented by the formula:

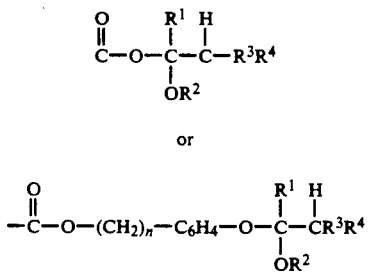

where $n=0-4$; $R^1$ is hydrogen or lower alkyl; $R^2$ is lower alkyl; and $R^3$ and $R^4$ independently are hydrogen or lower alkyl where the definition of lower alkyl include the joining of $R^1$ and $R^2$ or $R^1$ and either $R^3$ or $R^4$, or $R^2$ and either $R^3$ or $R^4$ to form a 5-, 6-, or 7-membered ring; (b) an initiator system that forms a catalytic amount of strong acid upon exposure to actinic radiation having a wavelength between about 3000 Å to about 9000 Å, and the other surface of the layer having adhered thereto with low to moderate adherence a thin, flexible, polymer film support; then:
   b. exposing the layer, imagewise, to actinic radiation to form an image;
   c. stripping the film support from the resulting image-bearing layer; and then;
   d. washing away the exposed areas of the layer to form a positive resist image;
   e. permanently modifying the adjacent areas on the substrate surface which are unprotected by the resist image by using a reagent capable of etching said areas or depositing a material on said area, and,
   without the need to apply a second coating of photosensitive material;
   f. imagewise exposing the resist layer again to form a second latent image;
   g. washing away the exposed areas of the layer to form a positive resist image;
   h. permanently modifying the adjacent areas as in step e;
   i. solubilizing the resist and stripping from the substrate.

16. The process of claim 15 wherein the photosensitive layer contains a plasticizer.

17. The process of claim 15 wherein the photosensitive layer contains a colorant.

18. The process of claim 15 wherein the sensitive layer contains an adhesion promoter.

19. The process of claim 15 wherein the photosensitive layer contains a surfactant.

20. The process of claim 15 wherein the polymer is selected from a homopolymer, copolymer, terpolymer and block polymer.

21. The process of claim 20 wherein the polymer is a copolymer benzyl methacrylate and tetrahydropyranyl methacrylate.

22. The process of claim 20 where a monomer used to form said polymer is selected from the group comprising:
   1-ethoxyethyl methacrylate,
   1-ethoxyethyl acrylate,
   1-butoxyethyl methacrylate,
   1-butoxyethyl acrylate,
   1-ethoxy-1-propyl methacrylate,
   1-ethoxy-1-propyl acrylate,
   tetrahydropyranyl methacrylate,
   tetrahydropyranyl acrylate,
   tetrahydropyranyl p-vinylbenzoate,
   1-ethoxy-1-propyl-p-vinylbenzoate,
   4-(2-tetrahydropyranyloxy)benzyl methacrylate,
   4-(2-tetrahydropyranyloxy)benzyl acrylate,
   4-(1-butoxyethoxy)benzyl methacrylate, and
   4-(1-butoxyethoxy)benzyl acrylate.

23. The process of claim 15 wherein the polymer contains one or more comonomers having no pendant acid-labile groups.

24. The process of claim 23 wherein the polymer having no pendant acid-labile groups is selected from the group comprising: methyl methacrylate, butyl methacrylate, benzyl methacrylate, benzyl acrylate, styrene, 2-ethylhexyl methacrylate, and cyclohexyl methacrylate.

25. The process of claim 15 wherein the polymer is prepared by group transfer polymerization.

26. The process of claim 15 wherein the polymer is prepared by free radical polymerization.

27. The process of claim 15 wherein the initiator system contains an acid generator selected from diazonium, phosphonium, sulfonium, iodonium salts, halogen compounds, organometal/organohalogen combinations, benzoin esters and o-nitrobenzyl esters of strong acids, and N-hydroxyamide and N-hydroxyimide sulfonates, and aryl naphthoquinonediazide-4-sulfonates.

28. The process of claim 15 wherein the acid generator comprises about 0.1% to about 10% by weight of the photoresist composition.

* * * * *